United States Patent [19]

Agostino et al.

[11] Patent Number: 5,370,974
[45] Date of Patent: Dec. 6, 1994

[54] LASER EXPOSURE OF PHOTOSENSITIVE POLYIMIDE FOR PATTERN FORMATION

[75] Inventors: Peter A. Agostino, Canaan; Ajay P. Giri, Poughkeepsie; John R. Lankard, Sr., Mahopac; Ron J. McDonald, Gardner, all of N.Y.

[73] Assignee: International Business Machines Corporation, Armonk, N.Y.

[21] Appl. No.: 905,059

[22] Filed: Jun. 26, 1992

[51] Int. Cl.$^5$ .................................................. 522 2
[52] U.S. Cl. ............................ 430/325; 430/270; 430/945
[58] Field of Search ................................ G03C 5/16

[56] References Cited

U.S. PATENT DOCUMENTS

| | | |
|---|---|---|
| 4,812,880 | 3/1989 | Ogawa et al. .................. 430/325 |
| 4,826,756 | 5/1989 | Orvek ............................. 430/328 |
| 4,883,744 | 11/1989 | Feilchenfeld et al. ........... 430/325 |
| 4,902,378 | 2/1990 | Ouderkirk ....................... 156/643 |
| 4,968,581 | 11/1990 | Wu et al. ......................... 430/192 |
| 4,980,268 | 12/1990 | Bartmann et al. ............... 430/283 |
| 5,001,039 | 3/1991 | Ogoh ............................... 430/311 |
| 5,122,440 | 6/1992 | Chien .............................. 430/325 |

Primary Examiner—John Kight, III
Assistant Examiner—R. Johnson
Attorney, Agent, or Firm—Whitham, Curtis, Whitham & McGinn

[57] ABSTRACT

A method of patterning a preimidized benzophenone photoactive polymer used as a photoresist with a laser light source improves its crosslinking efficiency and reduces swelling, thereby enabling the formation of lines on the order of microns.

8 Claims, 1 Drawing Sheet

LASER EXPOSURE OF PHOTOSENSITIVE POLYIMIDE FOR PATTERN FORMATION

BACKGROUND OF THE INVENTION

1. Field of the Invention

The present invention is generally related to a method of patterning a preimidized benzophenone photoactive polymer used as a photoresist and, more particularly, to a method of using an excimer laser to improve the crosslinking efficiency of the to polymer.

2. Description of the Prior Art

Advances in semiconductor devices have necessitated the use of greater wiring density in electronic packages and more efficient processing methods. One method of reducing manufacturing time involves using photosensitive polyimide precursors as photoresists in place of standard polyimides, since the procedure employed for the photosensitive layers eliminates a number of steps normally required when conventional polyimide layers are employed. However, most photosensitive polyimides cannot withstand the high temperatures required during semiconductor and substrate manufacturing without flowing, which results in shape alteration, change in line widths and the like. Consequently, resist films comprising photosensitive polyimides are typically treated with a deep ultraviolet (DUV) light source to crosslink and harden the film. The DUV hardening process forms a thin highly crosslinked hard shell at the surface of the resist film at a wavelength of less than 290 nm. The resist film must then be further heated beyond the flow point to high enough temperatures to initiate widespread thermal crosslinking in the bulk of the resist. A photosensitive polyimide which is commonly used in semiconductor and/or substrate processing is a preimidized benzophenone photoactive polymer, commercially available as Ciba-Geigy 412. In a preferred processing method, an 7–10 μm thick film of the polymer is spin applied to a substrate and baked at 95°–105° C. A pattern is then projection exposed on the polymer using a mercury arc lamp at an output of 1200 mJ/cm2 at 365 nm to initiate crosslinking. Exposure at 365 nm will typically crosslink the polymer to the extent that molecular weight is doubled or quadrupled in the exposed areas of the film and, therefore, becomes insoluble in the cosolvent developer. The unexposed portion of the polymer remains chemically unchanged and solvent in the cosolvent developer. The pattern is then developed in a 50/50 cosolvent of xylene and Γ-butyralactone to reveal the pattern. A major drawback of patterning using a mercury arc lamp is that during development, the crosslinked portion of the polymer swells up to 100% of its original thickness, thereby causing the sidewalls of two adjacent lines of polymer to swell enough that they touch. This is due to the fact that only 3% or less of the polymer crosslinks. When the polymer is baked to remove the solvent, the polymer shrinks the swollen sidewalls which then separate to form strings of polymer which cross from one sidewall to the other across the open pattern. These strings of polymer interfere with the metallization of the pattern. Thus, patterning of the 412 polymer has been limited to the formation of vias on the order of millimeters in size.

U.S. Pat. No. 4,826,756 discloses a process for fully hardening a Novolak resin at a low temperature. The method utilizes a laser which provides a high power output at 308 nm to crosslink the resin. A hotplate, which is held at a constant temperature of about 120° C. is used to accelerate the crosslinking reaction.

SUMMARY OF THE INVENTION

It is therefore an object of the present invention to provide a method of exposing a preimidized benzophenone photoactive polymer used as a photoresist to increase its crosslink efficiency and density, thereby resulting in reduced swelling during development.

According to the invention, a laser is utilized to pattern the photoactive polymer at wavelengths of 300–330 nm. The exposure dose and time may be varied to achieve various degrees of crosslinking within the polymer. Thus, the polymer may be patterned to form vias on the order of millimeters in size or lines on the order of microns in size.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
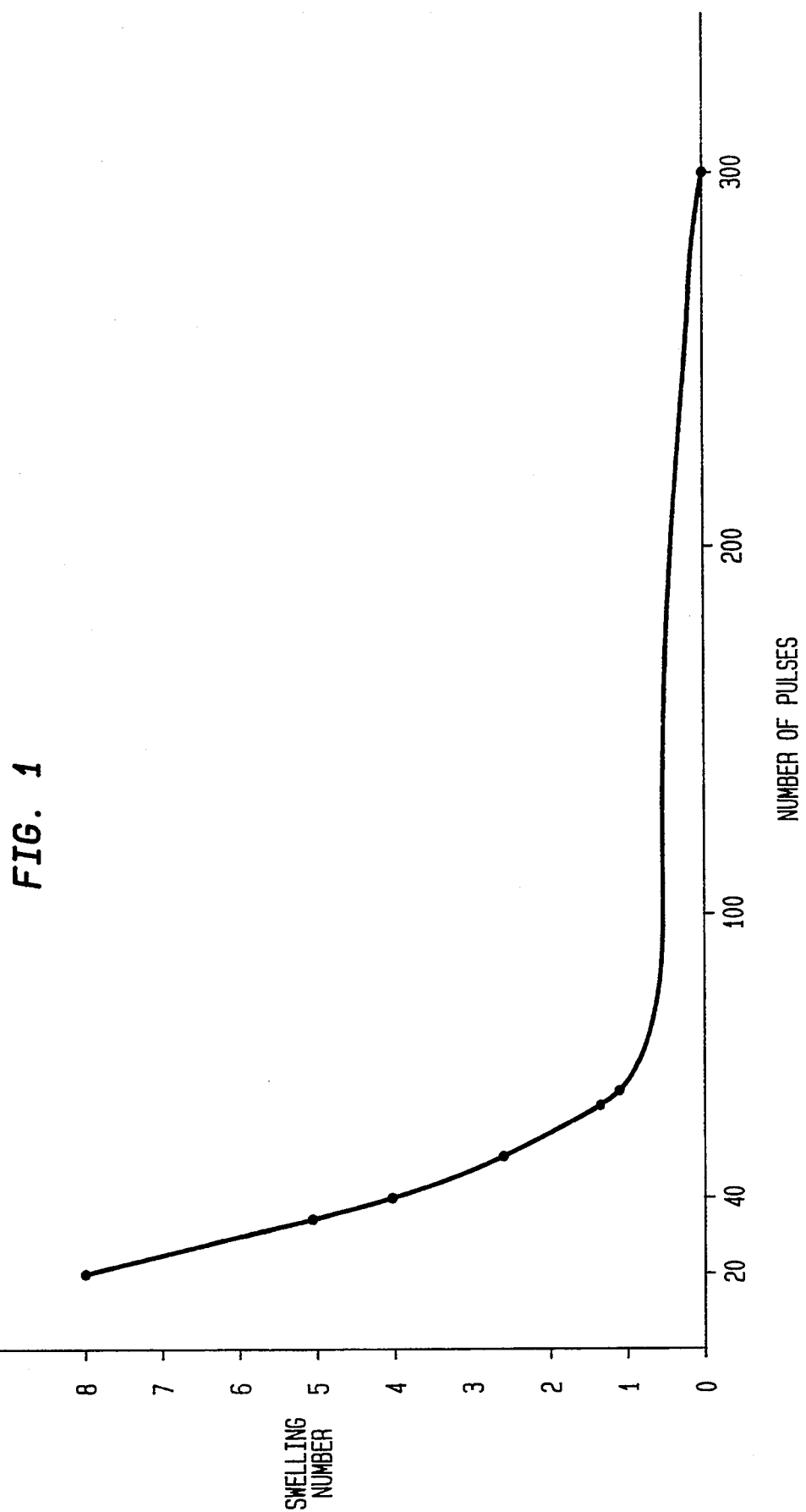
FIG. 1 is a graph of the change in film thickness of Ciba Geigy 412 photosensitive polyimide before and after patterning and development versus number of pulses from a laser light source.

Referring now to the drawings, and more particularly to FIG. 1, a graph of swelling versus number of pulses for an exposure dose of 30 mJ/cm2/pulse for Ciba Geigy 412 photosensitive polyimide is shown. Data was obtained by subjecting a film of the polymer to a series of exposures using a 308 nm excimer laser at a spot size of 1.7 cm×2.1 cm. A series of exposures ranging from 500 mJ/cm$^2$ to 36,000 mJ/cm$^2$ was run by controlling the number of pulses, as indicated on the x-axis. Cross-linking was observed to start at about 22 pulses and the polymer was substantially 100% crosslinked at 300 pulses, although cracking was observed at 300 pulses. The optimum energy input at a wavelength of 308 nm is approximately 15,000 mJ/cm$^2$. Swelling is a measure of the difference in the film thickness after application of a film of polymer to a substrate, but before patterning, and the film thickness after exposure and development. The data evidences that it is possible to reduce swelling of the pattern sidewalls using a laser for patterning. For example, a 1.8 second exposure to laser light at a wavelength of 308 nm resulted in film swelling of only 12.5%.

It is well known that benzophenone compounds are photoactivated by light at 330 nm and that incorporation of these compounds in polymers shifts photosensitivity to lower wavelengths. However, heretofore, patterning at these lower wavelengths has not been practicable since the energy output of a mercury arc lamp at wavelengths of 300 to 330 nm is very low, thereby requiring extended manufacturing times. The inventors have discovered that patterning of photosensitive polyimide is ideally performed at a wavelength of 312 nm. Using a commercially available excimer laser which provides a wavelength of 308 nm, it is possible to pattern a photosensitive polyimide film in a fraction of the amount of time required using a mercury arc lamp. For example, swelling was the same for an expose time of 0.08 seconds using an excimer laser at 1200 mJ/cm2 as compared to 23 seconds using mercury light. Moreover, up to 100% crosslinking can be achieved and, concomitantly, swelling eliminated, thereby enabling the formation of lines in photosensitive polyimide on the order of 12 µm.

In a preferred embodiment of the invention, an 7–10 µm film of Ciba-Geigy 412 is spin applied to a substrate. The substrate may be silicon, glass, ceramic or the like. The resulting structure is then baked at 100° C. plus or minus 5° C. for approximately 30 minutes. The film is then exposed to an excimer laser from 3 to 6 seconds at 50 Hertz and at a fluence of 25–35 mJ/cm$^2$. Exposure time and dosage may be adjusted to achieve various degrees of crosslinking depending upon the desired application. The film is then developed for 8 minutes in a 50/50 cosolvent of xylene and Γ-butyralactone to reveal the pattern.

While the invention has been described in terms of a single preferred embodiment which is directed to the use of Ciba Geigy 412, the use of other preimidized benzophenone photoactive polymers is contemplated by this invention. Moreover, various laser light sources providing wavelengths in the 300–330 nm range may also be utilized. Those skilled in the art will recognize that the invention can be practiced with further modification within the spirit and scope of the appended claims.

Having thus described our invention, what we claim as new and desire to secure by Letters Patent is as follows:

1. A method of forming a pattern of openings in a layer of preimidized benzophenone photoactive polymer formed on a substrate, comprising the steps of:
   forming a covering layer of preimidized benzophenone photo-active polymer over a surface of said substrate;
   irradiating portions of said covering layer with light from a laser light source that has a wavelength in a range between 300 and 330 nanometers in regions of said covering layer bordering locations of said openings in order to cross-link said covering layer in said regions substantially throughout said regions of said covering layer which are irradiated; and
   developing said pattern of opening in said layer with a solvent that removes those portions of said covering layer that have not been irradiated by said laser light source.

2. A method of forming a pattern of openings in a layer of preimidized benzophenone photo-active polymer formed on a substrate, comprising the steps of:
   forming a covering layer of preimidized benzophenone photo-active polymer over a surface of said substrate;
   irradiating portions of said covering layer with light from a laser light source that has a wavelength in a range between 300 and 330 nanometers and an energy level in a range of 9200 mJ/cm$^2$ to 30,000 mJ/cm$^2$ in regions of said covering layer bordering locations of said openings in order to cross-link said covering layer in said regions substantially throughout said regions of said covering layer which are irradiated; and
   developing said pattern of opening in said layer with a solvent that removes those portions of said covering layer that have not been irradiated by said laser light source.

3. A method of cross-linking a layer of preimidized benzophenone photo-active polymer as in claim 1, wherein said laser light source is an excimer laser.

4. A method of cross-linking a layer of preimidized benzophenone photo-active polymer as in claim 2, wherein said laser light source is an excimer laser.

5. A method of cross-linking a layer of preimidized benzophenone photo-active polymer as in claim 1, wherein said wavelength is approximately 308 nanometers.

6. A method of cross-linking a layer of preimidized benzophenone photo-active polymer as in claim 2, wherein said wavelength is approximately 308 nanometers and said energy level is approximately 15,000 mJ/cm$^2$.

7. A method as in claim 1, wherein the thickness of said covering layer is in a range between 7 and 10 µm.

8. A method as in claim 2, wherein the thickness of said covering layer is in a range between 7 and 10 µm.

* * * * *